United States Patent
McMillan et al.

[11] Patent Number: 5,829,988
[45] Date of Patent: Nov. 3, 1998

[54] SOCKET ASSEMBLY FOR INTEGRATED CIRCUIT CHIP CARRIER PACKAGE

[75] Inventors: John R. McMillan, Southlake; William H. Maslakow, Lewisville; Marc A. Abelanet, Irving, all of Tex.

[73] Assignee: Amkor Electronics, Inc., West Chester, Pa.

[21] Appl. No.: 748,752

[22] Filed: Nov. 14, 1996

[51] Int. Cl.⁶ .............................. H01R 9/09; H05K 1/00
[52] U.S. Cl. ............................. 439/70; 439/331
[58] Field of Search .................. 439/66, 70, 71, 439/72, 73, 331

[56] References Cited

U.S. PATENT DOCUMENTS

| | | | |
|---|---|---|---|
| 3,975,072 | 8/1976 | Ammon | 339/17 LC |
| 4,220,393 | 9/1980 | Ammon et al. | 339/221 M |
| 4,804,132 | 2/1989 | DiFrancesco | 228/115 |
| 5,068,062 | 11/1991 | Imata et al. | 252/518 |
| 5,073,117 | 12/1991 | Malhi et al. | 439/71 |
| 5,083,697 | 1/1992 | DiFrancesco | 228/116 |
| 5,151,040 | 9/1992 | Tanaka | 439/73 |
| 5,194,695 | 3/1993 | Maslakow | 174/52.4 |
| 5,205,743 | 4/1993 | Goff et al. | 439/73 |
| 5,232,372 | 8/1993 | Bradley et al. | 439/66 |
| 5,241,133 | 8/1993 | Mullen, III et al. | 174/52.4 |
| 5,395,254 | 3/1995 | Mogi | 439/71 |
| 5,471,011 | 11/1995 | Maslakow | 174/52.4 |
| 5,475,317 | 12/1995 | Smith | 439/71 |
| 5,483,740 | 1/1996 | Maslakow | 29/827 |
| 5,561,594 | 10/1996 | Wakefield | 439/66 |
| 5,628,636 | 5/1997 | Ollivier | 439/892 |

OTHER PUBLICATIONS

"MCC Workshop Overview/Summary," Internal Memorandum by Bill Maslakow, Amkor Electronics LPD, Feb. 7, 1996.

"Solving the Interconnect Puzzle," *IBM Technology Products Endicott Electronic Package, Cable and Connector Products,* IBM, undated.

"Particle Interconnect: A New Interconnect Technology," DiFrancesco, Larry, Proceedings of the Surface Mount International Conference, MCM–L Interconnection Technology, Aug. 1993 (reprint).

*Primary Examiner*—Neil Abrams
*Assistant Examiner*—Katrina Davis
*Attorney, Agent, or Firm*—Jenkens & Gilchrist, a Professional Corporation

[57] ABSTRACT

A socket for a ball grid array chip carrier package containing a die which is electrically interconnected. Individual spring elements in the socket are utilized for interconnecting each ball of the ball grid array. The individual spring elements provide upward pressure against individual sections of a substrate in direct contact with the balls of the ball grid array. The individual sections of the substrate are formed into individual beam members that are permitted to flex in response to pressure from the underlying spring elements.

51 Claims, 4 Drawing Sheets

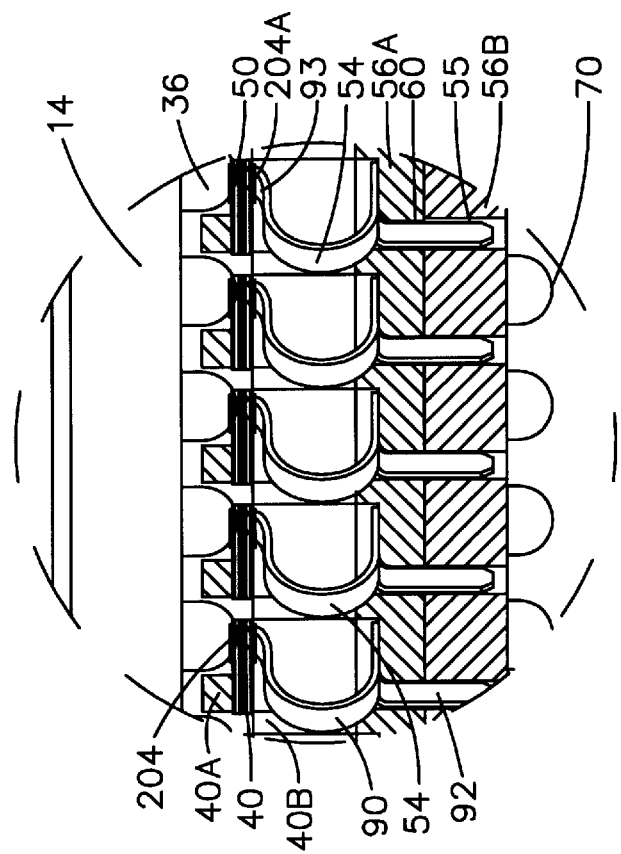
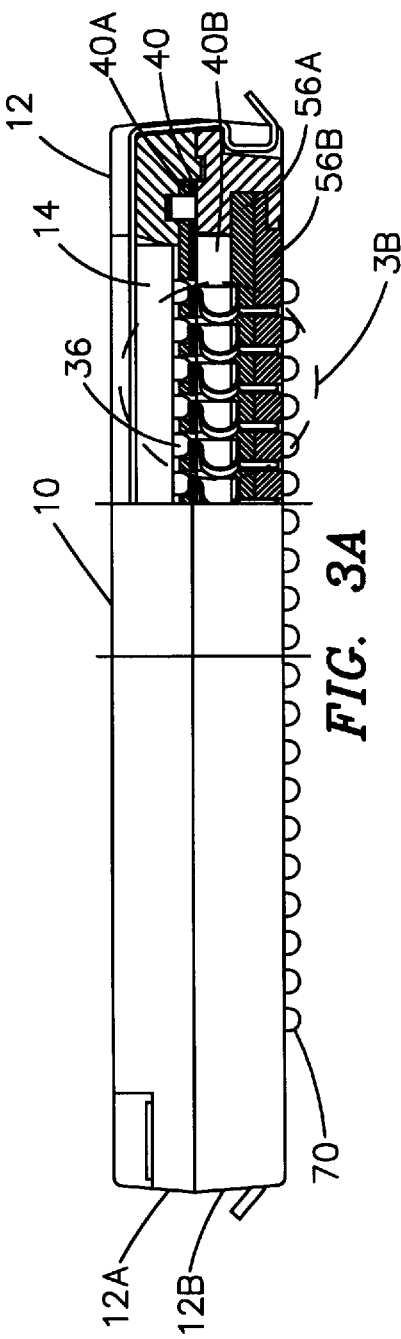

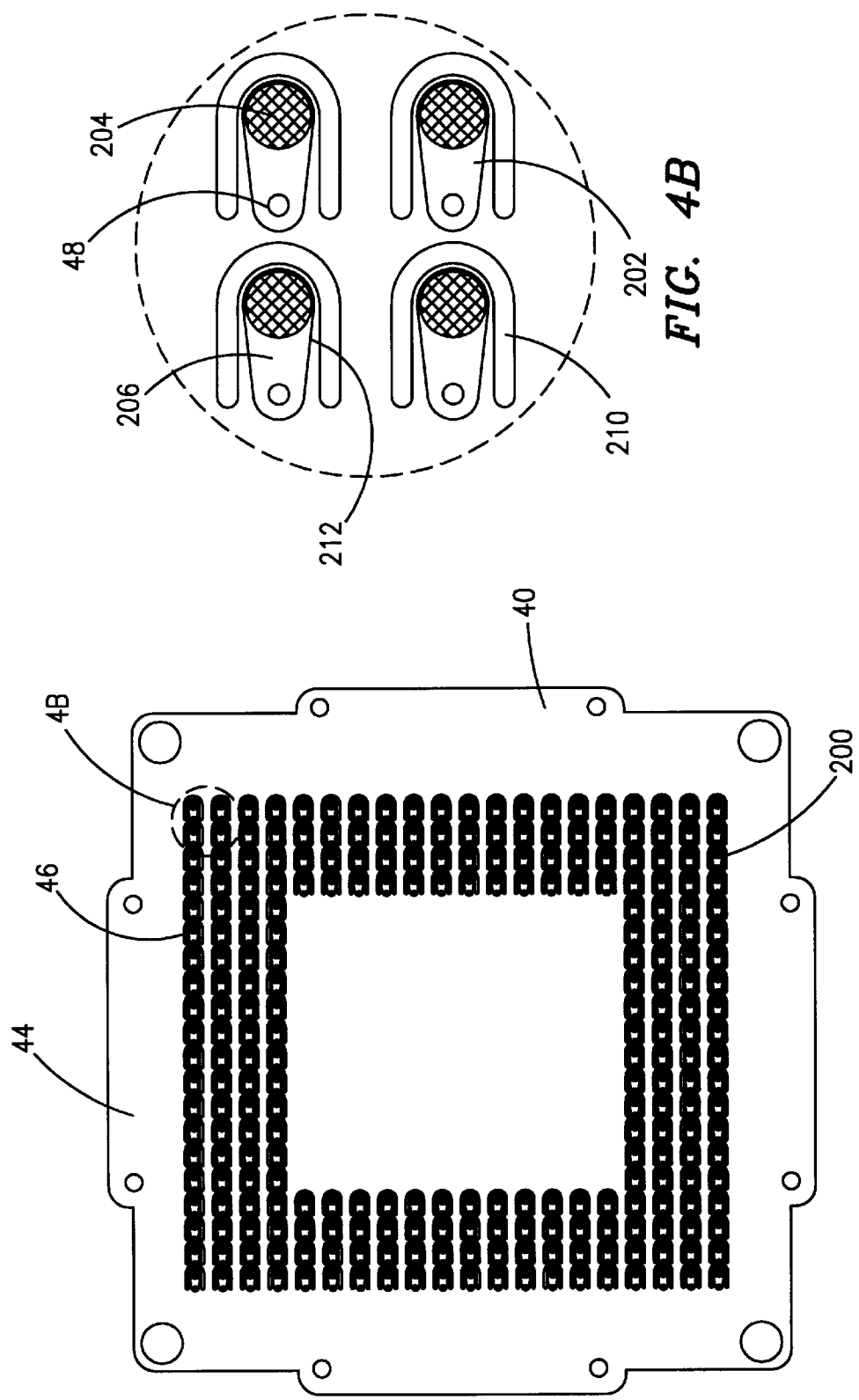

SOCKET ASSEMBLY FOR INTEGRATED CIRCUIT CHIP CARRIER PACKAGE

FIELD OF THE INVENTION

The present invention relates generally to integrated circuit chip mounting systems and more particularly, but not by way of limitation, to a ball grid array (BGA) chip carrier packages socket assembly for replacably mounting an integrated circuit chip, upon a printed circuit board or the like.

BACKGROUND OF THE PRIOR ART

It is conventional in the electronic industry to utilize semi-conductor devices such as integrated circuit chips ("dies") on printed circuit boards as key elements of electronic design. The technology associated with this complex industry has abounded over the years. Encapsulation packages ("chip carrier packages") are now commonly used to protect the die from the environment and provide means for mechanically and electrically mounting the die for operative electrical interconnection to a circuit of a printed circuit board. The importance of the integrated circuit chip in advanced electronic designs has required that printed circuit board manufacturing processes address the need for mounting densely configured leads of chip carrier packages to printed circuit boards. In prior years the mounting of electrical components such as capacitors and resistors was commonly effected by directly soldering the lead of the component to a printed circuit board or wherein the leads would extend through the substrate of the printed circuit board in electrical contact therewith. As technology has improved, both the effectiveness of chip carrier packages manufacturing and the density of the leads has increased many times over. Today the leads of chip carrier packages are high in number and small in size. The leads often proliferate the perimeter of the chip carrier packages. Rather than eight to fifteen leads extending from a single integrated circuit chip of earlier vintage, conventional chip carrier packages can manifest fifty to several hundred leads. For this reason, the protection and interconnection of said leads is critical for an effective assembly to a printed circuit board.

Chip carrier packages serve multiple functions as they protect a die from environmental hazards, and provide means for electrically and mechanically attaching the die to an intended device. A primary focus in the design of a chip carrier package is to provide the die with adequate protection from moisture and other elements of the environment. One approach for designing chip carrier packages is the total encasement chip carrier packages (TE package). The TE package generally includes a lead frame having a die mounting pad, an integrated circuit die which is attached to the die mounting pad, a plurality of fragile wires which connect the die to the lead frame, and a thermoset plastic which total encases the lead frame, the die and the plurality of fragile wires. The TE package has several problems which arise from the thermoset plastic's direct contact with the die and the plurality of fragile wires. First, the thermoset plastic's direct contact with the plurality of fragile wires, which connect the die to the lead frame. The molding process may cause a disruption of the planarity or spacing of the fragile wires, which can produce electrical shorting of the plurality of fragile wires, thus, resulting in die failure or damage. Second, different coefficients of thermal expansion exist for the die, the lead frame, the plurality of fragile wires and the thermoset plastic. Materials having different coefficients of thermal expansion expand and contract at different rates during temperature variations. Temperature variations are produced during the molding process of the TE package, during final solder attachment of the TE package to the intended device and during the operation of the die within the TE package. The temperature variations provide the possibility for disassociation of the thermoset plastic from the die and the plurality of fragile wires. Disassociation of the thermoset plastic from the die and the plurality of fragile wires produces die failure and/or damage resulting from wire stress failure or wire bond connection failure. The temperature variations further provide the possibility for the formation of voids. Third, the thermoset plastic utilized in the manufacture of the TE package exhibits hygroscopic properties. The hygroscopic properties of the TE package allow moisture to enter and accumulate in the formed voids. High temperatures are required during the final solder attachment of the TE package to the intended device. The high temperatures can convert the moisture, located within the formed voids, into steam, thereby expanding and cracking the TE package or the die.

There are many prior art approaches for designing chip carrier packages to provide adequate protection from the external environment. A myriad of potential reliability problems, however, also exist and plague the integrated circuit chip industry. The secure and reliable mounting of the die is critical, but there are no assurances that chip failure won't later ensue. Additionally, there are often reasons for replacing integrated circuit chips on printed circuit boards other than chip failure. It may, for example, be possible to upgrade the performance of a printed circuit board by replacing an old chip with one having a more advanced design.

The upgrade of an existing system has many advantages. These advantages include performance enhancement, system expansion; repairability, and system flexibility. Relative to system flexibility, it is common for manufacturers to develop integrated circuits (IC's) with specific performance characteristics. It is also common for manufacturers to upgrade those performance characteristics in a short time. For this reason, non-permanent chip installations have been considered important for the chip industry.

The non-permanent mounting of the above described chip carrier packages has, in certain instances, incorporated printed circuit board sockets that are themselves primarily designed and suitable for positioning on, and mechanical and electrical interconnection with, printed circuit boards. The sockets may be wave soldered to the printed circuit board to thereby provide for receipt of the chip carrier packages. The chip carrier packages are often more delicate than other components of the printed circuit board such as resistors, transistors, diodes and the like. One such example of prior art sockets is seen in U.S. Pat. No. 3,975,072 assigned to Elfab Corporation. This socket addresses a low profile, integrated circuit connector; a precursor design to the advanced carrier chip packages described above. Such prior art devices have a reduced number of leads (10 to 15) compared to the chip carrier package of today. The density of the electrical contact points of the chip carrier package is, in and of itself, a major design issue. As seen in the prior art '072 patent, the installed component can be removed from the socket for replacement when desirable. In case of a failed component, it can be replaced and a new one inserted. Without the ability to interchange components, a printed circuit board may have to be reworked or even scrapped in the event of failure. This aspect is critical with regard to the cost of advanced design chip carrier packages of today.

The utilization of sockets for the mounting of chip carrier packages is a clear marketing asset. Sockets afford numerous advantages that fixed assemblies do not. As discussed above, a permanently soldered circuit chip package cannot be easily replaced in the event of component failure. For this reason, new socket designs such as Test and Burn-In sockets, Device Under Test (DUT) sockets, and Production sockets have found acceptance in the industry. A burn-in socket differs from a production socket in that it is utilized in the manufacture of a device. Burn-in sockets are used to test components and receive thousand of cycles per socket as components are introduced and moved therefrom for testing. An example of a test socket for a leadless component such as an integrated circuit chip is seen in U.S. Pat. No. 5,205,742. Production sockets may be smaller, more compact, and typically of less cost because of the infrequency of use. A production socket may be opened, for example, perhaps four or five times during its whole life. Reliability issues exist with such sockets, however, due to the fact that any replacement of chip carrier packages therein can theoretically result in lead and connection problems. Where reliability is such a critical issue, there are significant criteria for electrical contact. Currently the most reliable way to effect reliable electrical contact is to provide a high amount of force in the socket lead contact mechanism. A spring design is typically used in such socket contacts to engage and displace oxides and insulative contaminates on the contact points. When oxide is displaced, the contact action (electrical contact) is more securely made. If for some reason, expansion, contraction, or other movement from heat or vibration causes the contact to move, atmospheric contaminants be generated between the contact points reducing the integrity of the assembly.

In dealing with socket assemblies, it is not always possible to provide the high degree of pressure conventionally necessary for reliable contact connections. There are, for example, height and size restrictions and large contacts can reduce electrical performance to restrict the fidelity of the signal passing therethrough. Moreover, printed circuit boards on small computers and laptops are being produced with thinner boards which reduce the amount of pressure that can be supported therefrom. It would be an advantage therefore to provide a low force socket with high reliability. It would also be an advantage to provide a socket particularly adapted for chip carrier packages having dense lead arrays. The present invention provides such an advance over the prior art by utilizing individual spring sections for generating an electro-mechanical interconnection socket for a ball grid array chip carrier package.

SUMMARY

The present invention relates to a socket assembly for chip carrier packages. More specifically, the present invention pertains to a socket assembly for a chip carrier packages comprising a socket housing adapted for receiving chip carrier packages therein. The chip carrier packages are formed with electrical contact points comprising a ball grid array (BGA) deployed across the bottom surface, therein providing means for electrical connection therefrom. A first substrate is disposed in the housing and includes a plurality of electrical contact points deployed about a top surface thereof, interconnected with a plurality of electrical contact points deployed about a bottom surface thereof connected to the contact points of the top surface. The contact points of the top surface are also deployed in an array adapted for mating engagement with the electrical contact points of the chip carrier packages. Atmospheric contaminants can be generated between contact points reducing the integrity of the electrical contact and assembly. A second substrate is thus disposed within the housing beneath the first substrate and positioned in generally parallel spaced relationship therefrom. A plurality of contact members having spring sections are secured in the second substrate and up stand therefrom in resilient contact with the electrical contact points of the bottom surface of the first substrate. The contact members bear upwardly there against with a spring action thereupon. Means are provided for electrically connecting the contact members to an underlying electrical contact array. The underlying array may comprise a connector for the socket. Means are also provided for securing the package against the first substrate with the contact points of each in electrical connection one with the other.

In another aspect, the present invention includes a BGA socket assembly for a chip carrier package, wherein the invention comprises a socket housing adapted for receiving the BGA chip carrier package therein. A first substrate is disposed in an upper portion of the housing with a plurality of first electrical contact points disposed about a top surface thereof, adapted for engagement with the electrical contact points of the chip carrier package. An alignment plate adapted for positioning above the first substrate within the socket housing and for receiving the electrical contact points therein in alignment with the contact points of the first substrate is provided for facilitating the inter engagement therebetween. The alignment plate, in essence, matches the footprint of the chip carrier package and maintains the alignment of the contact portions thereof with the contact points of the first substrate. Means are provided for electrically connecting the contact points of the first substrate to socket interconnection means which provide interconnection of the socket to another electrical element such as a printed circuit board. The utilization of the above-described alignment plate in conjunction with the contact points of the first substrate facilitate flexibility in the socket mounting of the BGA chip carrier package. Means are then provided for securing the chip carrier package against the substrate with the solder balls of the BGA in electrical connection with the electrical contact points of the first substrate.

In another aspect, the above-described socket utilizing the alignment plate further includes the first substrate being formed with a plurality of individually segmented, beam sections disposed beneath apertures formed in the alignment plate. The beam sections provide flexibility to variations in the size of the solder balls of the BGA chip carrier package and/or any other dimensional variations thereof to enhance the reliability of the socket of the present invention. Consistent therewith, one aspect of the above described invention also includes the above described contact members comprising generally "C" shaped spring sections. The spring sections engage the first substrate beneath the segmented beam sections thereof to exert an upward force there against and further accommodate variations in dimensions of the BGA chip carrier package.

In another aspect, the above described invention includes the securement means for the package comprising a lid adapted for mating engagement with the housing in securement therewith. The contact points of the socket may also comprise solder balls depending downwardly therefrom. The means for electrical communication of the second substrate may then comprise a solder ball array disposed on the bottom side of the second substrate adapted for soldering in connection with another electrical interconnection member. Finally, the contact members may comprise generally "C" shaped spring sections adapted for applying an upward force to individual sections of the first substrate for purposes of enhancing the interconnection with the chip carrier package.

BRIEF DESCRIPTION OF THE DRAWINGS

For a more complete understanding of the present invention and for further objects and advantages thereof, reference may now be had to the following description taken in conjunction with the accompanying drawings, in which:

FIG. 3A is a side elevational, partial cross-sectional view of the socket of FIG. 1 taken along lines 3—3 thereof;

FIG. 3B is an enlarged side elevational cross-sectional view of circuit contact members disposed within the socket of FIG. 3A;

FIG. 4A is a top plan view of the top substrates of the socket of FIG. 3A; and

FIG. 4B is an enlarged top plan view of the substrate of FIG. 4A.

DESCRIPTION OF THE PREFERRED EMBODIMENT

Figure 1:
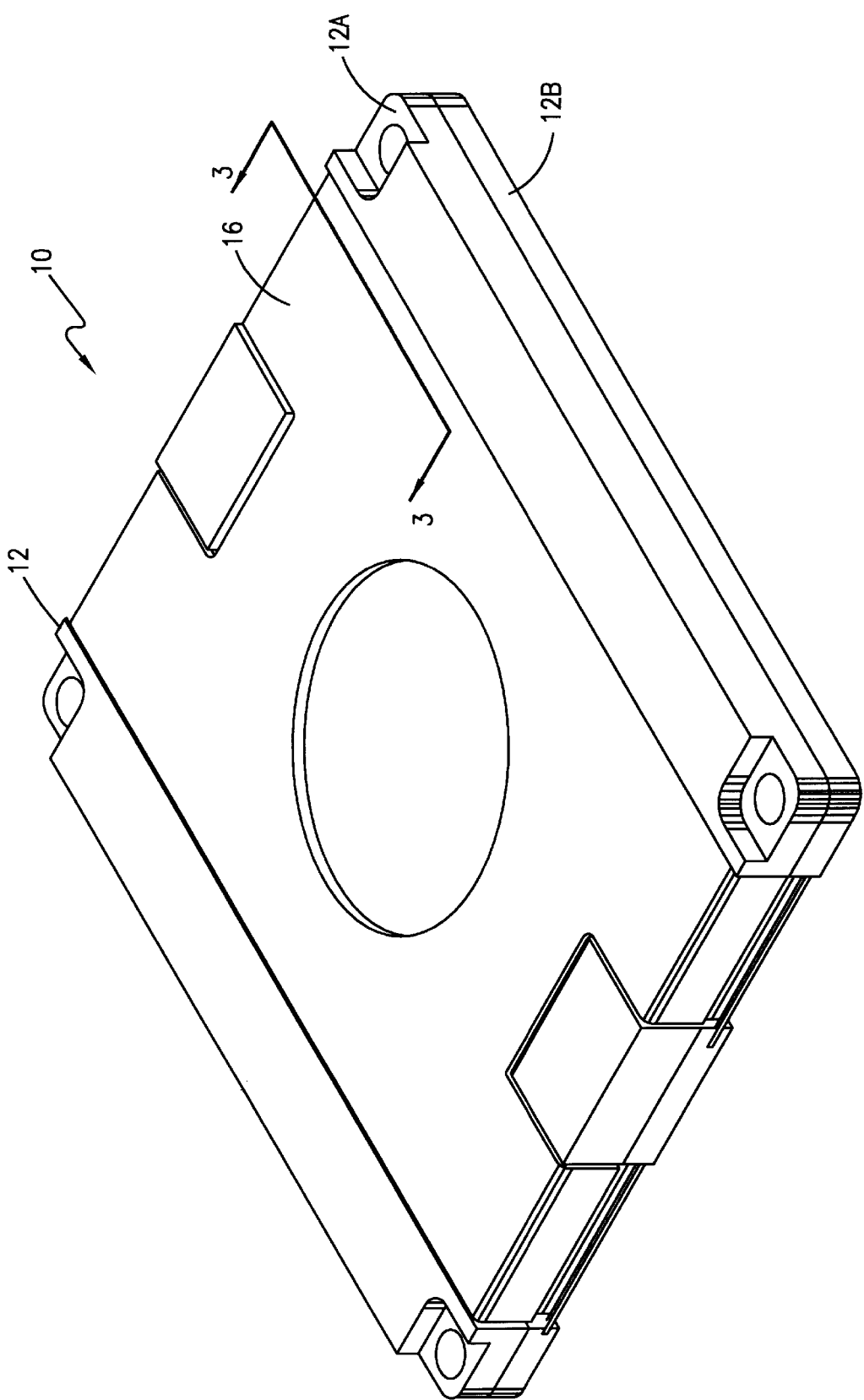
FIG. 1 is a perspective view of an integrated circuit chip socket constructed in accordance with the principles of the present invention.

FIG. 1 is a perspective view of an integrated chip socket 10 constructed in accordance with the principles of the present invention. The socket 10 comprises a housing 12, comprised of upper housing 12A and lower housing 12B, adapted for receiving a chip carrier package therein while a lid 16 (which may comprise a securement strap) is adapted for placement thereover. As described below, the socket 10 is constructed to provide reliable, electro mechanical connection between a chip carrier package and an underlying substrate (not shown) to which the socket 10 may be connected. In accordance with the principles of the present invention, the lid 16 may be removed from the housing 12 to expose the appropriate chip carrier package or other electrical component secured therein. The chip carrier package may itself be removed for replacement in the event of malfunction or a desire to upgrade the underlying printed circuit board. As defined below, the socket 10 of the present invention affords functional flexibility with an enhanced reliability and improved electro mechanical integrity in an integrated circuit chip socket specifically adapted for state of the art chip carrier packages.

Still referring to FIG. 1, the socket 10 of the present invention may be manufactured in a low-cost configuration allowing for low profile applications compatible with lap top computer systems. Socket 10 is structurally designed to accept stress without the need for the conventionally high normal force between socket contact members generally required to insure electrical contact reliability. Although high normal force provides compliant connections during temperature cycles and/or dimensional mismatches, the socket 10 accommodates wide tolerance variations in both lateral and vertical seating. As described below, self alignment is afforded through an alignment plate with vertical dimensional variations accommodated through flexibility in the contact plate itself These advantages are provided without the high normal force between contact members conventional in the electrical connector industry and with the requisite reliability expected therewith. It is well known that socket designs must be capable of housing and connecting chip carrier packages for a minimum of two to three years with sometimes five to ten upgrades. Ball size variations are compensated for with sufficiently low force so as not to damage the chip carrier package during insertion or during use.

Figure 2:
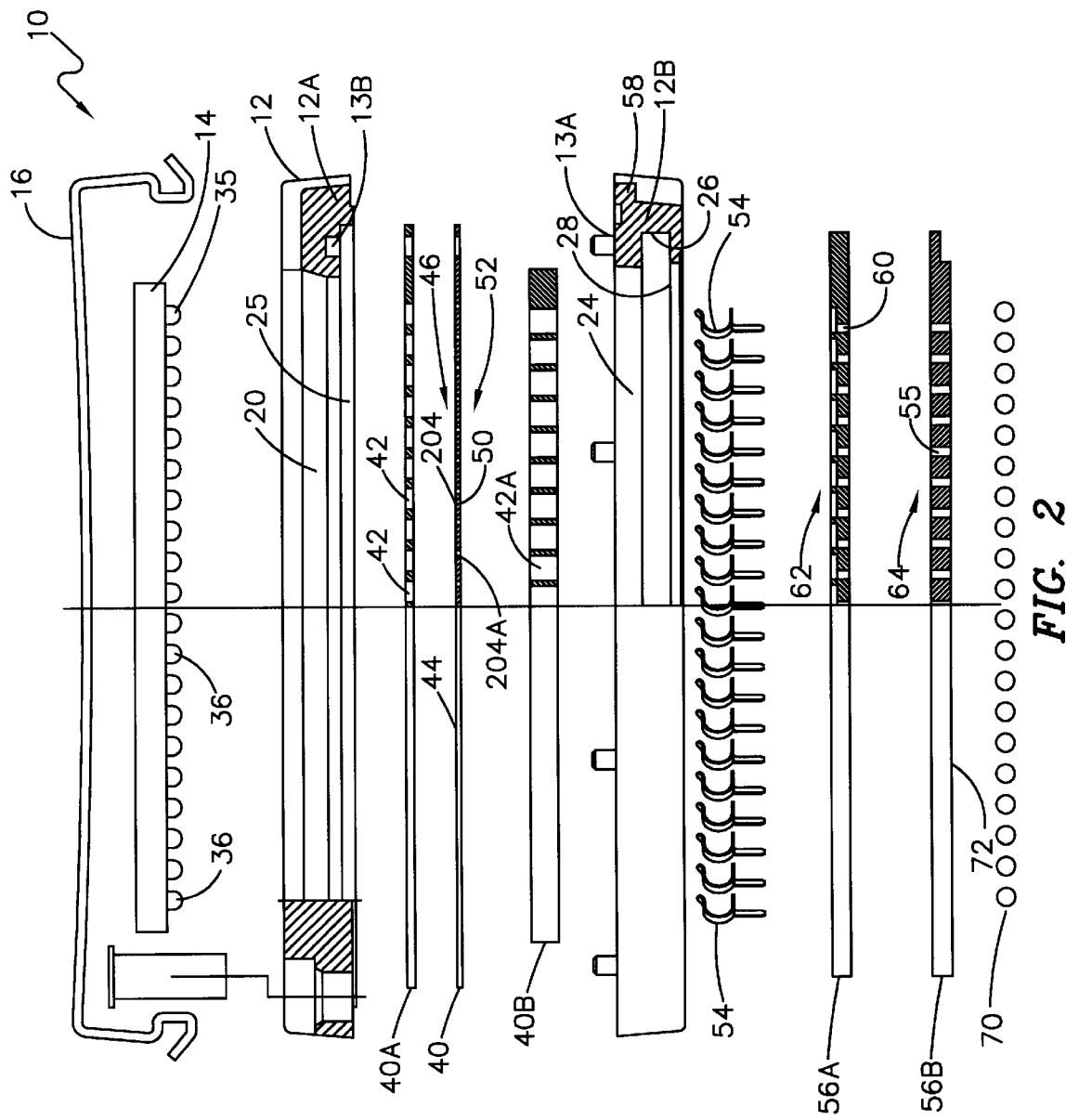
FIG. 2 is a exploded, side elevational cross sectional view of the assembly of the socket of the present invention.

Referring now to FIG. 2, there is shown a side elevational, cross-sectional, exploded view of the integrated circuit chip socket 10 constructed in accordance with the principles of the present invention. As stated above, the socket 10 is constructed with a housing 12 adapted for receiving an electrical component such as a chip carrier package 14 therein. Lid 16 is adapted for receipt over and engagement of the upper housing 12A. The present invention incorporates the utilization of a plurality of contact members and substrates secured within the housing 12 to effect reliable electro mechanical connection between the socket 10 and the chip carrier package 14. The package 14 is preferably of the ball grid array variety, comprising solder balls 36 in an array 35.

Still referring to FIG. 2, the housing 12 is constructed of upper housing 12A which mates with lower housing 12B. Mating fingers 13A of lower housing 12B extend to engage mating holes 13B of upper housing 12A. Upper housing 12A includes open cavity 20 into which a series of shoulders and lips are formed for securement of package 14 therein. Open cavity 20 is formed contiguous to and in alignment with a lower cavity 24 formed in lower housing 12B. Lower cavity 24 is formed with recessed side walls 26 and a lower lip 28 extending inwardly therefrom for mating engagement with molded seat plate 56A and substrate 56B. Seat plate 56A and substrate 56B, described below, are secured within lower housing 12B and within recess 26 and form the bottom of the assembled housing 12. Once assembled, substrate 40 and molded insulator plate 40B and molded alignment plate 40A comprise a reliable socket assembly in conjunction with contact members 54, also discussed below.

Referring still to FIG. 2, the molded seat plate 56A and substrate 56B are integrally secured within lower housing 12B by a molding operation. Once fabricated, seat plate 56A is secured atop substrate 56B with the apertures of each in registry one with the other and the lower housing 12B molded therearound. This provides an integral assembly capable of supporting the contact members 54 in a precise registry with the elements of the upper housing 12A placed thereover. Proper alignment and structural integrity are key advantages of the present invention provided, in part, by these assembly features.

Referring now to FIGS. 3A and 3B, there are shown side elevational views of the assembled socket of FIG. 2. FIG. 3B is an enlarged portion of the contact assembly of FIG. 3A. It may be seen that the contact members 54 referred to above are formed with a generally "C" shaped spring section 90 and a depending post, or tail, portion 92 extending downwardly therefrom. The tail 92 is adapted for passage through aperture 60 (shown best in FIG. 3B) of the molded seat plate 56A and securement in the contiguous aperture 55 of substrate 56B for electrical and mechanical contact and engagement therewith. The contact members 54 are each fabricated of beryllium copper, or the like, and include a curved or flared tip 93 adapted for upwardly bearing contact with a conductive contact point 50 of substrate 40. Contact point 50 is the area of contact region 204A described below. The tip 93 is designed to secure electrical engagement with contact point 50, and may include a particle interconnect coating to maximize reliability therebetween. The use of the particle interconnect coating is an optional aspect of the present invention and may be preferable in certain applications where oxidation is a consideration. A particle interconnect coating may be used, however, because one parameter in the reliability aspect of the socket depends upon secure electro mechanical contact between the contact members 54 and the contact points 50. Particle interconnect provides multiple parallel connections using a hard diamond crystal structure that is fused with a nickel coating to make it electrically conductive. Because of the nature of the particles they easily puncture any oxides that may form on contact surfaces and go into the base metal of said contact surface. Such base metal penetration is extremely advantageous for assuring reliable electro mechanical interconnection. Because there are so many particles in each contact surface, if one disassociates itself because of an oxide buildup, the additional particles in the same contact area can complete the electrical engagement therebetween.

In the design of such a socket system, it is necessary to address the pressures typically associated with socket systems. Typically, 50 to 100 grams of pressure are utilized per contact to complete electrical engagement. The use of "grams" is common in the industry for such designations of pressure. With a 200 lead device, the force generated may exceed 20,000 grams. It may be seen that for such a very small and fragile unit, 20 kilograms is a very high force, particularly with the substrates and printed circuit boards being fabricated in smaller and thinner configurations. The present invention defines a low force application which does not necessarily reduce the final cost of the socket. The miniaturization of the components actually may cause an increase in the cost of the socket, but will provide the performance enhancements required to meet the requirements of the IC circuits and makes the added cost worthwhile. The present contact members, formed from beryllium copper, with the C shaped sections 90 shown above, may be fabricated to provide less than 10 grams of force per contact in the interconnect method. This reduction in force permits the socket to be configured in a low profile design without massive structural surfaces that would ordinarily be necessary to handle high levels of force.

Referring now to FIGS. 2 and 4A in combination, there is shown the substrate 40, which may comprise thin film tape, such as Kapton or a laminated board. A top plan view of top substrate 40 is shown in FIG. 4A, while a side elevational view is shown in FIG. 2. Referring to both Figures, the substrate 40 is adapted for being received within cavity 25 of upper housing 12A for securement against the solder balls 36 of ball grid array 35 of chip carrier package 14. In that regard, a plurality of first electrical contact points 204 are formed on the top surface 44 of substrate 40 to form an array 46 there across. The array 46 is configured for abutting, mating engagement with the solder balls 36 of ball grid array 35 of chip carrier package 14. Each contact point 204 comprises a conductive portion of a metalized laminate surface portion of the substrate 40, which will be described in more detail below. The contact points 204 are each positioned for precise alignment with a solder ball 36 of ball grid array 35 of chip carrier package 14, and each contact point 204 is connected to a contact point 50 disposed in the bottom of the substrate 40 through a plated aperture 48. The contact points 50 form a second electrical contact point array 52. The second contact point array 52 is likewise configured for mating engagement with a series of contact members 54 that up stand from lower substrate 56B and seat plate 56A disposed therebeneath. The pair of plates 40A and 40B sandwich substrate 40 therebetween and function as locating and alignment fixtures for the solder balls 36 and contact members 54, respectively. Each of the plates 40A and 40B is constructed with a plurality of apertures 42 and 42A respectively, formed therein for positioning in registry with ball grid array 35 and the contact members 54, respectively. The presence of insulating plate 40B also reduces cross talk between adjacent contact members. Apertures 60 are formed in an array 62 in molded seat plate 56A that is configured to match an array 64 of plated through holes 55 formed in substrate 56B. The plated through holes 55 of substrate 56B connect the contact members 54 to an electrical contact array 70 disposed on the underside of 56B thereof The array 70 may comprise solder balls, or the like.

Referring now to FIG. 4A and 4B in combination, circuit pattern 200 comprises a multitude of individual circuit traces 202. The traces are formed with a first enlarged contact region 204 and a second connection region 206 which connects contact region 204 to an identical contact region 204A formed on the underside thereof through plated through hole 48. Contact region 204A is shown in FIG. 3B. What is shown in this particular view is the fact that a plurality of circuit traces 202 are provided in side-by-side relationship along and across the top surface of the substrate 40 for providing the electrical contact points necessary for engaging the balls 36 of ball grid array 35 shown in FIG. 2. Around each circuit trace 202 a section of the substrate 40 is formed with a slot 210. Slot 210 is formed in general U-shaped configuration to isolate a beam section 212 that is sandwiched between the top contact region 204 and underside contact region 204A. As described below, a degree of flexibility is also afforded in this construction.

Referring still to FIG. 4B, it may be more clearly seen that discrete portions of the substrate 40 are fabricated as beam sections 212, around each contact point 204. The beam sections 212 are isolated within the substrate 40 by "U" shaped slotted portion 210 which extends around three sides of beam section 212 to form a moveable region of substrate 40. The beam section 212 may be formed by etching or by laser to permit them to pivot upwardly and downwardly. In this manner, spring force supplied beneath the beam section 212 will cause it to pivot upwardly against the contact surface of the solder ball 36 of ball grid array 35 as shown in FIG. 1. This spring actuation further secures the reliability of the electrical interconnection between the solder balls 36 and the substrate 40. The upward pressure exerted against the solder balls 36 is afforded by the C shaped section 90 of contact member 54. In this manner, any unevenness in the ball grid array 35 or individual ball elements may be accommodated by a flexing of a beam section 212 while maintaining a generally consistent pressure from the spring section 90 therebeneath. As stated above, the connection extends from solder ball 36 to contact region 204 through connection region 206, through plated through hole 48 to contact region 204A. A similar connection region would, of course, be included between contact region 204A and plated through hole 48.

Referring back now to FIG. 2, the lid 16 is assembled to the socket housing 12 to secure the chip carrier package 14 therein. In this position, it may be seen that the ball grid array 35 of the chip carrier package 14 may be disposed in electrical contact with first electrical contact points of first electrical contact point array 46 of substrate 40. The contact points 204 of the top surface 44 of the substrate 40 (described above) are thus in electrical contact with the ball grid array 35 of the chip carrier package 14, while lower seat plate 56A and substrate 56B are disposed therebeneath in generally parallel spaced relationship thereto. The contact members 54 secured in substrate 56B and seat plate 56A up stand therefrom in spring contact with the electrical contact points 50 of substrate 40. The contact members 54 bearing against the contact points 50 therein provide electrical connection therewith and through the plated through holes 55 connecting the contact members 54 to the electrical contact pattern comprising ball grid array 70 of substrate 56B. The socket 10 is thereby adapted for electro mechanical connection with a printed circuit board by wave soldering or other conventional fashion.

It may thus be seen that the proper construction of substrate 40 is integral to the effective operation of the present invention. Substrate 40 affords through the beam sections 212 isolated by the U-shaped slots 210, a multitude of individually flexing contact regions for engaging the ball grid array 35 of the chip carrier package 14 shown in FIG. 2. As stated above, any inconsistencies in the size of the solder balls 36 (shown in FIG. 2) may be accommodated by flexing of the beam sections 212 of substrate 40. Spring tension to impart flexing is provided by the generally C-shaped sections 90 of contact members 54 (as shown most clearly in FIG. 3B). In this manner, a reliable assembly may be provided for enhanced effectiveness in the utilization of chip carrier packages.

It may also be seen that the proper construction of the present invention includes the utilization of the alignment plate 40A and insulating plate 40B. These elements allow the present invention to accommodate the tolerances of conventional chip carrier packages on the market today. The solder balls 36 of the array 35 self align within the apertures 42 of the alignment plate 40A. In this manner, the sides of the chip carrier package body is not utilized for precise positioning and therein facilitating greater flexibility and accommodation of tolerance variations. It may thus be seen that the "footprint" of the particular chip carrier package 14 may be self-alignable within the alignment plate 40A. This self-alignment feature in conjunction with the flexible beam sections of the substrate 40, in conjunction with the spring sections of contact 54 there beneath accommodate wide variations in both solder ball size and planarity of the chip carrier package 14. Stated in another way, the alignment plate 40A facilitates two-dimensional lateral self alignment of the chip carrier package 14 while the beam sections of substrate 40 facilitate vertical self-alignment in seating of the electrical contact points. The socket 10 of the present invention thus presents a three dimensional, self-alignment system for integrated circuit chip carrier packages providing for reliable socket mounting thereof.

It is thus believed that the operation and construction of the present invention will be apparent from the foregoing description. While the method and apparatus shown or described has been characterized as being preferred, it will be obvious that various changes and modifications may be made therein without departing from the spirit and scope of the invention as defined in the following claims.

What is claimed is:

1. A socket assembly for a ball grid array chip carrier package containing a die therein in electrical interconnection therewith, said package having a substantially planar bottom surface, and a plurality of solder balls forming electrical contact points in electrical communication with said die, said assembly comprising:

a socket housing adapted for receiving said package therein;

a first substrate disposed in an upper portion of said housing and having a plurality of first electrical contact points disposed about a top surface thereof and electrically interconnected with a plurality of second electrical contact points disposed about a bottom surface thereof;

said first contact points of said top surface being disposed in an array adapted for mating engagement with said solder balls of said package;

a second substrate disposed within a lower portion of said housing beneath said first substrate, disposed in generally parallel spaced relationship relative thereto, and being formed with a socket contact array across a bottom surface thereof;

a plurality of contact members secured in said second substrate and upstanding therefrom in contact with said second electrical contact points of said bottom surface of said first substrate and bearing upwardly there against with a spring action thereupon;

means for electrically connecting said contact members to said socket contact array of said second substrate; and means for securing said package against said first substrate with said contact points of each in electrical connection one with the other.

2. The apparatus as set forth in claim 1 wherein said contact members include spring sections.

3. The apparatus as set forth in claim 2 wherein said first substrate includes a plurality of flexible beam sections upon which said electrical contact members are secured.

4. The apparatus as set forth in claim 2 wherein said beam sections comprise land areas formed by generally U-shaped slots therearound.

5. The apparatus set forth in claim 2 wherein said electrical interconnections between said first and second electrical contact points comprise plated through holes formed in said beam sections.

6. The apparatus as set forth in claim 1 wherein said securement means for said package includes a lid adapted for mating engagement with said housing in securement therewith.

7. The apparatus as set forth in claim 1 wherein said socket contact array of said second substrate comprises solder balls disposed on the bottom side of said second substrate adapted for soldering in connection with another electrical interconnection member.

8. The apparatus as set forth in claim 1 wherein said contact members comprise generally "C" shaped spring sections adapted for applying an upward force to individual beam sections of said first substrate.

9. The apparatus as set forth in claim 1 and further including an alignment plate for placement upon said first substrate for alignment of said solder balls of said ball grid array chip carrier package.

10. The apparatus as s et forth in claim 9 wherein said alignment plate includes a plurality of apertures disposed in select arrays relative to said electrical contact points.

11. A method of removably receiving a ball grid array chip carrier package having solder balls depending therefrom in electrical interconnection with a printed circuit board comprising the steps of:

providing a socket housing for said chip carrier package adapted for receiving said chip carrier package therein;

providing a first substrate having a plurality of first electrical contact points disposed across a top surface thereof and a plurality of second electrical contact points disposed across a bottom surface thereof in connection to said first contact points;

securing said first substrate in an upper portion of said housing;

providing a second substrate for positioning beneath said first substrate, said second substrate being formed with a plurality of apertures formed therethrough;

providing a plurality of contact members for receipt within said apertures of said second substrate for upstanding therefrom in contact with said second electrical contact points of said first substrate;

mounting said contact members within said apertures of said second substrate;

connecting said contact members of said second substrate to an electrical contact array disposed on a bottom surface of said second substrate;

securing said second substrate within said housing in generally parallel spaced relationship with said first substrate and causing said contact members to engage said first substrate; and securing said chip carrier package in said housing with said solder balls contacting said first electrical contact points, wherein said ball grid array of said chip carrier package is electrically connected to said contact members and to said electrical contact array disposed on said bottom surface of said second substrate whereby said bottom portion of said second substrate may be electrically connected to a printed circuit board for electrical connection of said chip carrier package to said printed circuit board.

12. The method as set forth in claim 11 and further including the step of forming said contact members with spring sections adapted for providing spring engagement between said second substrate and said first substrate.

13. The method as set forth in claim 12 and further including the step of forming said first substrate with a plurality of flexible beam sections upon which said first electrical contact members points are disposed.

14. The method as set forth in claim 11 and further including the step of providing a lid adapted for mating engagement with said housing for securing said chip carrier package therein.

15. The method as set forth in claim 11 and further including the step of forming said electrical contact points of said chip carrier package in the form of a solder ball grid array depending downwardly therefrom.

16. The method as set forth in claim 11 and further including the step of forming said electrical contact array of said second substrate in the form of a solder ball grid array disposed on the bottom side of said second substrate adapted for soldering to other electrical connection members.

17. The method as set forth in claim 11 and further including the step of forming said contact members with generally "C" shaped upper sections comprising spring sections adapted for applying an upward force to individual sections of said first substrate.

18. The method as set forth in claim 17 and further including the step of forming said individual beam sections of said first substrate for flexing under the upward pressure of said "C" shaped spring sections.

19. The method as set forth in claim 11 and further including the step of forming said housing in two sections adapted for mating one with the other.

20. The method as set forth in claim 19 and further including the step of securing an alignment plate within said housing for alignment of said solder balls therein in mating engagement with said first electrical contact points of said first substrate.

21. A socket adapted for removably receiving a ball grid array chip carrier package having solder balls depending therefrom in electrical interconnection with a printed circuit board, said socket comprising:

a socket housing for receipt of said chip carrier package therein;

a first substrate having a plurality of first electrical contact points disposed across a top surface thereof and a plurality of second electrical contact points disposed across a bottom surface thereof in connection to said first contact points, means for securing said first substrate in an upper portion of said housing;

a second substrate for positioning beneath said first substrate within said housing, said second substrate being formed with a plurality of apertures formed therethrough;

a plurality of contact members secured within said apertures of second substrate and upstanding therefrom in contact with said second electrical contact points of said first substrate;

means connecting said contact members of said second substrate to an electrical contact array disposed on a bottom surface of said second substrate;

means securing said second substrate within said housing in generally parallel spaced relationship with said first substrate wherein said contact members engage said first substrate;

means securing said chip carrier package in said housing with said solder balls contacting said first electrical contact points, wherein said ball grid array of said chip carrier package is electrically connected to said contact members and to said electrical contact array disposed on said bottom surface of said second substance and whereby said bottom portion of said second substrate may be electrically connected to a printed circuit board for electrical connection of said chip carrier package to said printed circuit board.

22. The socket as set forth in claim 21 and further including said contact members being formed with spring sections adapted for providing spring engagement between said second substrate and said first substrates.

23. The socket as set forth in claim 21 and further including said first substrate being formed with a plurality of flexible beam sections upon which said first electrical contact points are disposed.

24. The socket as set forth in claim 21 and further including a lid adapted for mating engagement with said housing for securing said chip carrier package therein.

25. The socket as set forth in claim 21 and further including said electrical contact points of said chip carrier package being formed in a solder ball grid array depending downwardly therefrom.

26. The socket as set forth in claim 21 and further including said electrical contact array of said second substrate being formed as a solder ball grid array disposed on the bottom side of said second substrate adapted for soldering to other electrical connection members.

27. The socket as set forth in claim 21 and further including said contact members being formed with generally "C" shaped upper sections comprising spring sections adapted for applying an upward force to individual sections of said first substrate.

28. The socket as set forth in claim 27 and further including slotted beam sections formed in said first substrate and adapted for flexing under the pressure of said "C" shaped spring sections.

29. The socket as set forth in claim 21 and further including said housing being formed in two sections adapted for mating one with the other.

30. The socket as set forth in claim 29 and further including an alignment plate secured within said housing atop said first substrate for alignment of said solder balls of said chip carrier package therein in mating engagement with said first electrical contact points of said first substrate.

31. The socket as set forth in claim 30 wherein said alignment plate comprises a sheet formed with a plurality of apertures arranged in registry with said first electrical contact points.

32. The socket as set forth in claim 31 wherein said sheet is formed of molded plastic.

33. The socket as set forth in claim 29 including an insulating plate secured within said housing beneath said first substrate for insulation of said contact members therein in mating engagement with said second electrical contact points of said first substrate.

34. The socket as set forth in claim 33 wherein said insulating plate comprises a sheet formed with a plurality of apertures arranged in registry with said second electrical contact points.

35. The socket as set forth in claim 34 wherein said sheet is formed of molded plastic.

36. The socket as set forth in claim 35 and further including said contact members being formed with generally "C" shaped upper sections comprising spring sections adapted for applying an upward force to individual sections of said first substrate and wherein said sheet is formed of a thickness generally equivalent to the height of said generally "C" shaped upper section of said contact members for isolating said "C" shaped upper sections one from the other and insulating said "C" shaped sections one from the other to reduce electrical interference there between.

37. The socket as set forth in claim 21 and further including a molded seat plate adapted for securement atop said second substrate and having a plurality of apertures formed therethrough adapted for receiving said contact members therein for upstanding therefrom, said seat plate being formed with slotted portions thereof adapted for orienting said contact members therein.

38. The apparatus set forth in claim 37 wherein said seat plate and said second substrate are adapted for being molded within a lower one of said two sections of said housing with said second substrate.

39. The socket as set forth in claim 38 and further including an upper housing section adapted for receipt of said chip carrier package therein with an alignment plate secured therein beneath said chip carrier package and above said first substrate for aligning said solder balls there against.

40. The apparatus set forth in claim 39 wherein said first substrate is formed with a plurality of slotted beam sections, each of said beam sections being formed around individual ones of said first electrical contact points.

41. A socket assembly for a ball grid array chip carrier package of the type having a substantially planar bottom surface and plurality of solder balls depending therefrom, said assembly comprising:

a socket housing adapted for receiving said package therein, and having lower electrical contact points there across for connection with another electrical component;

a first substrate disposed in an upper portion of said housing and having a plurality of first electrical contact points disposed across a top surface thereof adapted for engagement with said solder balls of said package;

an alignment plate having apertures formed therein and adapted for positioning above said first substrate within said housing for receiving said solder balls therein in alignment with said first contact points of said first substrate for facilitating the inter engagement therebetween;

means for electrically connecting said first contact points of said first substrate to said lower contact points of said housing; and means for securing said package against said first substrate.

42. The socket assembly of claim 41 wherein said electrical connecting means comprises:

second electrical contact points disposed across a bottom surface of said first substrate electrically interconnected with said first contact points;

a second substrate disposed within a lower portion of said housing beneath said first substrate, disposed in generally parallel spaced relationship relative thereto, and being formed with a socket contact array across a bottom surface thereof;

a plurality of contact members secured in said second substrate and upstanding therefrom in contact with said second electrical contact points of said bottom surface of said first substrate an bearing upwardly there against with a spring action thereupon;

means for electrically connecting said contact members to said socket contact array of said second substrate; and means for securing said package against said first substrate with said contact points of each in electrical connection one with the other.

43. The apparatus as set forth in claim 42 wherein said contact members comprise spring sections.

44. The apparatus as set forth in claim 43 wherein said first substrate includes a plurality of flexible beam sections upon which said electrical contact members are secured.

45. The apparatus as set forth in claim 44 wherein said beam sections comprise land area formed by generally U-shaped slots therearound.

46. The apparatus as set forth in claim 45 wherein said electrical interconnections between said first and second electrical contact points comprise plated through holes formed in said beam sections.

47. The apparatus as set forth in claim 42 wherein said securement means for said package includes a lid adapted for mating engagement with said housing in securement therewith.

48. The apparatus as set forth in claim 42 wherein said socket contact array of said second substrate comprises solder balls disposed on the bottom side of said second substrate adapted for soldering in connection with another electrical interconnection member.

49. The apparatus set forth in claim 42 wherein said contact members comprise generally "C" shaped spring sections adapted for applying an upward force to individual sections of said first substrate.

50. The apparatus as set forth in claim 42 wherein said alignment plate is adapted for placement adjacent to said first substrate for alignment of said solder balls.

51. The apparatus as set forth in claim 50 wherein said alignment plate includes a plurality of apertures disposed in select arrays relative to said electrical contact points.

* * * * *

UNITED STATES PATENT AND TRADEMARK OFFICE
CERTIFICATE OF CORRECTION

PATENT NO. : 5,829,988      Page 1 of 3
DATED : Nov. 3, 1998
INVENTOR(S) : McMillan et al.

It is certified that error appears in the above-identified patent and that said Letters Patent is hereby corrected as shown below:

Column 4, line 4      Replace "up stand"
     With --upstand--

Column 4, line 7      Replace "there against"
     With --thereagainst--

Column 4, line 24      Replace "inter engagement"
     With --interengagement--

Column 5, line 31      Replace "electro mechanical"
     With --electromechanical--

Column 5, line 42      Replace "electro mechanical"
     With --electromechanical--

Column 6, line 11      Replace "electro mechanical"
     With --electromechanical--

Column 6, lines 65-66      Replace "electro mechanical"
     With --electromechanical--

Column 7, line 7      Replace "electro mechanical"
     With --electromechanical--

UNITED STATES PATENT AND TRADEMARK OFFICE
CERTIFICATE OF CORRECTION

PATENT NO. : 5,829,988  
DATED : Nov. 3, 1998  
INVENTOR(S) : McMillan et al.

It is certified that error appears in the above-identified patent and that said Letters Patent is hereby corrected as shown below:

| | |
|---|---|
| Column 7, line 45 | Replace "there across" With --thereacross-- |
| Column 7, line 58 | Replace "up stand" With --upstand-- |
| Column 8, lines 61-62 | Replace "up stand" With --upstand-- |
| Column 9, lines 1-2 | Replace "electro mechanical" With --electromechanical-- |
| Column 10, lines 9-10 | Replace "there against" With --thereagainst-- |
| Column 10, line 44 | Replace "s et" With --set-- |
| Column 13, line 39 | Replace "there against" With --thereagainst-- |
| Column 13, lines 49-50 | Replace "there across" With --thereacross-- |

UNITED STATES PATENT AND TRADEMARK OFFICE
CERTIFICATE OF CORRECTION

PATENT NO. : 5,829,988
DATED : Nov. 3, 1998
INVENTOR(S) : McMillan et al.

It is certified that error appears in the above-identified patent and that said Letters Patent is hereby corrected as shown below:

Column 13, line 60   Replace "inter engagement"
 With --interengagement--

Column 14, line 21   Replace "there against"
 With --thereagainst--

Signed and Sealed this

Twenty-ninth Day of June, 1999

Attest:

Q. TODD DICKINSON

Attesting Officer   Acting Commissioner of Patents and Trademarks